United States Patent
Tai

(10) Patent No.: US 6,291,346 B1
(45) Date of Patent: Sep. 18, 2001

(54) TITANIUM SILICIDE LAYER FORMATION METHOD

(75) Inventor: Kaori Tai, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 09/366,327

(22) Filed: Aug. 2, 1999

(30) Foreign Application Priority Data

Oct. 23, 1998 (JP) .................................................. 10-302155

(51) Int. Cl.$^7$ ...................................................... H01L 21/44
(52) U.S. Cl. ............................................. 438/683; 438/680
(58) Field of Search .................................. 438/655, 656, 438/648, 683, 680, 644

(56) References Cited

U.S. PATENT DOCUMENTS

| | | |
|---|---|---|
| 5,595,784 | 1/1997 | Kaim et al. . |
| 5,976,976 | * 11/1999 | Doan et al. ........................... 438/683 |
| 6,020,259 | * 2/2000 | Chen et al. ........................... 438/648 |

FOREIGN PATENT DOCUMENTS

| | | |
|---|---|---|
| 6-69157 | 3/1994 | (JP) . |
| 8-213343 | 8/1996 | (JP) . |
| 8-255770 | 10/1996 | (JP) . |

OTHER PUBLICATIONS

T. Miyamoto et al., "Development of Ti film deposition technology using ECR CVD with minimized Si etching and low Cl content", Jun. 27–29, 1995 VMIC Conference, pp. 195–197.

T. Taguwa et al., "Silicide Formation During Titanium Chemical Vapor Deposition", Jun. 10–12, 1997 VMIC Conference, pp. 255–257.

T. Miyamoto et al., "development of Ti film deposition technology using ECR CVD with minimized Si etching and low CL content",Jun. 27–29, 1995 VMIC OCnference, pp. 195–197.*

T Taguwa et al., "Silicide Formation During Titanium CVD" Jun. 10–12, 1997 VMIC Conference, pp. 255–257.*

\* cited by examiner

*Primary Examiner*—David Nelms
*Assistant Examiner*—Dung A Le
(74) *Attorney, Agent, or Firm*—Jones Volentine, PLLC

(57) ABSTRACT

In a $TiSi_2$ layer formation method in which a Ti layer is formed by a CVD method supplying $TiCl_4$ gas together with a carrier gas at a prescribed temperature onto a Si layer and forming a $TiSi_2$ layer by having the Ti layer react with the Si layer in a self-aligning manner, the $TiCl_4$ gas is supplied at the flow rate proportion of over 0.5% of the total gas flow rate. Or, a halogen type gas such as HCl gas and $Cl_2$ gas is added to the $TiCl_4$ gas by the flow rate proportion of 0.05%~1% of the flow rate of the $TiCl_4$ gas. Or, after the Ti layer film is formed, the $TiCl_4$ gas is supplied for a prescribed length of time without discharging plasma.

3 Claims, 3 Drawing Sheets

TITANIUM SILICIDE LAYER FORMATION METHOD

BACKGROUND OF THE INVENTION

1. Field of the Invention

The present invention relates to a titanium silicide ($TiSi_2$) layer formation method and a method of manufacturing a semiconductor device having a $TiSi_2$ layer, more particularly to a titanium silicide ($TiSi_2$) layer formation method in which a titanium (Ti) layer is formed by supplying $TiCl_4$ gas onto a silicon (Si) layer together with a carrier gas at a prescribed temperature by a CDV (Chemical Vapor Deposition) method and a $TiSi_2$ layer is selectively formed by having the Ti layer react with the Si layer.

2. Description of Related Art

In a semiconductor device such as a LSI, in order to obtain electric conductivity between the diffusion layer formed on the semiconductor substrate and the first metal, W plugs are embedded in the contact holes by the CDV method so as to use the W plugs as wires in the vertical direction. Since these W plugs adhere poorly to the oxide film which forms the outside wall of the contact holes, an adhesion layer such as a Ti layer and titanium nitride (TiN) layer is first formed on the contact hole surface by the spatter method and then a W layer is formed. After the Ti layer and TiN is formed, a RTA (Rapid Thermal Annealing) process is performed under the atmosphere of $N_2$ and $NH_3$, and the Ti layer formed on the Si substrate is made to react with the Si substrate to form a $TiSi_2$ layer. By forming a $TiSi_2$ layer on a Si layer in this manner, low contact resistance can be obtained.

Moreover, in recent years, due to the demand caused by the increased capacity of memories and the increased degree of integration of devices, memory cell size reduction research has been being advanced. As a result, the aspect ratio of the contact hole tends to be increased. However, in the case the aspect ratio of the contact hole is increased, if a Ti layer or a TiN layer is formed by the spatter method, the coverage deteriorates. As a result, a stable and satisfactory contact characteristic cannot be obtained, which is a problem. Hence, as a replacement of the spatter method, a technique for forming adhesion layers such as Ti layer and TiN layer by the CVD method has been developed and is receiving attention.

In this CVD method, a Ti layer is formed, for example, by flowing $TiCl_4$ gas on the substrate. According this CVD method, the Ti layer can be formed with a satisfactory degree of coverage even inside a contact hole having a very high aspect ratio. Moreover, according this CVD method, the Ti layer is formed at relatively high temperature. Therefore, when the Ti layer is formed on the Si layer, the Ti layer reacts with the Si layer. As a result, a $TiSi_2$ layer is selectively formed. Therefore, unlike the case in which a Ti layer is formed by the spatter method, according this CVD method, a TiSi layer can be formed on the Si layer (diffusion layer) inside the contact hole without performing a RTA process. In this case, the Ti layer does not react with an oxide layer film or nitride layer film. Hence, the Ti layer is not formed on the side wall of the contact hole (oxide layer film) as it is. After this, a TiN layer is formed by the CVD method.

In what follows, a Ti layer formed on an oxide film or nitride film by the CVD method will be referred to as a CVD-Ti layer. Similarly, a $TiSi_2$ layer formed by having a Ti layer formed on a Si layer react with Si by the CVD method will be referred to as a CVD-$TiSi_2$ layer.

In order to obtain electric conductivity between the CVD-$TiSi_2$ layer and the first metal, a tungsten (W) plug is formed inside the contact hole. This W plug is formed by filling W inside the contact hole by the CVD method and then removing the portion of the W layer not used for forming the plug by performing over-etching by an etch back process. However, in carrying out this etch back process, the W layer formed inside the plug is also etched. As a result, a recess is generated. In the case a large recess is made, for example, in forming a metal layer such as a layer of aluminum (Al) alloy in the next process, a step is created and the flatness of the layer is lost. This causes difficulty in patterning, which is a problem. Moreover, if the coverage of the Al alloy deteriorates, the reliability of the semiconductor device is reduced. Therefore, it is important to suppress the recess generation.

To cope with these problems, a method of carrying out a flattening process by the CMP (Chemical Mechanical Polishing) technique without etch-back processing the W layer formed besides the plug is being developed. According to this CMP technique, the recess generation inside the plug can be suppressed and the degree of flatness can be improved. With reference to FIGS. 3, 4, and 5, the method of forming a W plug by the CMP technique forming a $TiSi_2$ layer on a diffusion layer on a Si substrate inside the contact hole will be explained.

First, as shown in FIG. 3, an interlayer insulating film 102 is deposited on a semiconductor substrate 101 on which a device is formed. A contact hole 103 is then opened to obtain conductivity to the diffusion layer 108 of the Si substrate 101.

Next, a Ti film is formed by the spatter method to create a Ti layer 104, and a TiN film is formed by the spatter method to create a TiN layer 105. Next, by applying a RTA process, the diffusion layer (Si layer) of the Si substrate 101 is made to react with the Ti layer 104 to form a $TiSi_2$ layer 106 on the diffusion layer 108 on the Si substrate 101. In the case the CVD-Ti layer 104 is formed by the CVD method, without performing a RTA process, the CVD-Ti layer 104 reacts with the Si substrate 101. As a result, the CVD-Ti layer 106 is selectively formed. This Ti layer 106 is formed to obtain low contact resistance.

Next, as shown in FIG. 4, a film of W is formed by the CVD method to form a W layer 107. Moreover, as shown in FIG. 5, the portion of the W layer 107 not used for forming the plug is removed by the CMP method to form the W plug. After this, the contaminants generated during the CMP process is removed with diluted hydrofluoric acid water. Thus, a W plug is formed inside the contact hole.

However, even if the $TiSi_2$ layer is formed on the diffusion layer inside the contact hole by the spatter method or CVD method, in the case a W plug is formed by the CMOP method, the contaminants generated during the CMP process need to be removed with diluted hydrofluoric acid water. This hydrofluoric acid water dissolves Ti. Therefore, when the contaminants are removed, the Ti layer formed on the side wall of the contact hole is also etched. As a result, a cavity is created between the interlayer insulating film and the TiN film, which is a problem. Moreover, if the reaction advances and the $TiSi_2$ layer is etched, the electric conductivity between the $TiSi_2$ layer and the W plug is lost, resulting in contact conductivity failure, which is also a problem.

On the other hand, to prevent this problem, a TiN film forming method in which a TiN film is formed after removing the Ti layer formed on the side wall of the contact hole by a selective etching process with ammonia aqueous solution the like is known. According to this method, a TiN film is formed directly on the side wall of the contact hole without first forming a Ti layer on the side wall of the contact hole. Therefore, even if diluted hydrofluoric acid water is used to remove the contaminants generated by the CMP process, the etching by the diluted hydrofluoric acid water does not proceed to the $TiSi_2$ layer. Hence, contact conductivity failure does not occur. However, this method requires a new process for removing the Ti layer. This new process is expensive, and results in a high manufacturing cost, which is a problem.

SUMMARY OF THE INVENTION

Given these problems, it is an object of the present invention to provide a novel and improved $TiSi_2$ layer formation method capable of forming a $TiSi_2$ layer only on a Si layer without forming a Ti layer in any part besides the Si layer. It is also an object of the present invention to provide a method of manufacturing a semiconductor device having a $TiSi_2$ layer.

To solve these problems, according to the first aspect of the present invention, a $TiSi_2$ layer formation method is provided. This method has the following steps. A Ti layer is first formed by a CVD method supplying $TiCl_4$ gas together with a carrier gas that contains at least $H_2$ at a prescribed temperature onto a Si layer. A $TiSi_2$ layer is formed selectively by having the Ti layer react with the Si layer. In this case, the flow rate of the $TiCl_4$ gas is set over 0.5% of the total gas flow rate. The carrier gas suffices to contain at least $H_2$ gas in order to facilitate the chemical reaction $TiCl_4+H_2=Ti+4HCl$. An inactive gas such as Ar may be added to stabilize the plasma.

According to this method, simply by increasing the $TiCl_4$ flow rate above the level prescribed by the standard conditions, a Ti layer film can be formed on the Si layer while removing the Ti layer film that is formed on other portions besides the Si layer. Therefore, the Ti layer is not formed on any other portion besides the Si layer, and the $TiSi_2$ layer can be formed only on the Si layer.

Moreover, to solve the above-described problems, according to the second aspect of the invention, another $TiSi_2$ layer formation method is provided. This method has the following steps. A Ti layer is first formed by a CVD method supplying $TiCl_4$ gas together with a carrier gas at a prescribed temperature onto a Si layer. A $TiSi_2$ layer is formed selectively by having the Ti layer react with the Si layer. In this case, HCl gas and/or $Cl_2$ gas is added to the $TiCl_4$ gas at the flow rate proportion of 0.05%~1% of the flow rate of the $TiCl_4$ gas.

According to this method, simply by adding a halogen type gas such as HCl gas and/or $Cl_2$ gas in addition to the standard conditions to form a Ti layer, a Ti layer film can be formed on the Si layer while removing the Ti layer film formed on other portions besides the Si layer. Therefore, the Ti layer is not formed on any other portion besides the Si layer, and the $TiSi_2$ layer can be formed only on the Si layer. Moreover, since HCl gas and $Cl_2$ gas are chlorine type halogen type gases like the raw material $TiCl_4$ gas, the etching speed can be controlled easily by controlling the concentration of Cl.

Moreover, to solve the above-described problems, according to the third aspect of the invention, further another $TiSi_2$ layer formation method is provided. This method has the following steps. A Ti layer is first formed by a CVD method supplying $TiCl_4$ gas together with a carrier gas that contains at least $H_2$ at a prescribed temperature onto a Si layer. A $TiSi_2$ layer is formed selectively by having the Ti layer react with the Si layer. In this case, the $TiCl_4$ gas is supplied at the flow rate of 1~20 sccm to form the Ti layer film. After this, without discharging plasma, the $TiCl_4$ gas is supplied for a prescribe length of time at the flow rate of over 3 sccm.

According to this method, simply by stopping the plasma discharge after the CVD-Ti and CVD-$TiSi_2$ layer films are formed, the $TiCl_4$ gas can be supplied to remove the Ti layer formed on all the portions other than the Si layer. Moreover, since there is no need to add a halogen type gas such as HCl and $Cl_2$, fewer types of gas are needed, and the process conditions can be set more easily. Moreover, in the case the flow rate is increased as in the case of the first aspect of the invention, there is a possibility that the Si substrate will be etched. However in the third aspect of the invention, there is no need to increase the flow rate of $TiCl_4$. Hence, the Si substrate is not etched.

DETAILED DESCRIPTION OF THE INVENTION

In what follows, with reference to the attached drawings, preferred embodiments of the $TiSi_2$ layer formation method and method of manufacturing a semiconductor device having a $TiSi_2$ layer according to the present invention will be explained. In the following explanations and the attached drawings, the same reference numbers will be given to those components having the same function. Such components will be explained only once.

FIRST EMBODIMENT

In the first embodiment, raw material gas $TiCl_4$ is supplied at the flow rate proportion of over 0.5% of the total gas flow rate using the CVD method to form a CVD-Ti layer (CVD-$TiSi_2$ layer) inside a contact hole. This embodiment will be explained with reference to FIGS. 1 and 2.

Figure 1:
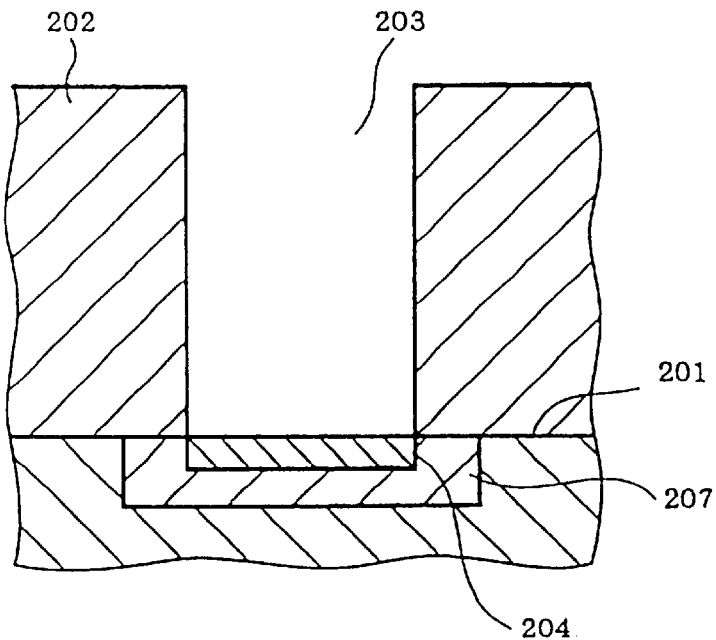
FIG. 1 shows a cross sectional view after a CVD-$TiSi_2$ layer has been formed on the diffusion layer inside a contact hole on the Si substrate in the W plug formation process according to the first through third embodiments of the invention.

First, as shown in FIG. 1, an interlayer insulating film 202 is deposited on a Si substrate 201 on which a device is formed. A contact hole 203 is then formed to access the diffusion layer 207 of the Si substrate 201. Next, using the CVD method, a film of CVD-Ti layer is formed.

A set of exemplary film formation conditions is provided below.

($TiCl_4$ flow rate)/(total gas flow rate)$\geq 0.005$, (for example, $TiCl_4$ flow rate: over 10 sccm, Ar flow rate: 500 sccm, $H_2$ flow rate: 1500 sccm), film formation temperature: over 500° C., preferably over 550° C., film formation pressure: 0.5~5 Torr, and plasma power: 250W (450 KHz).

Figure 3:
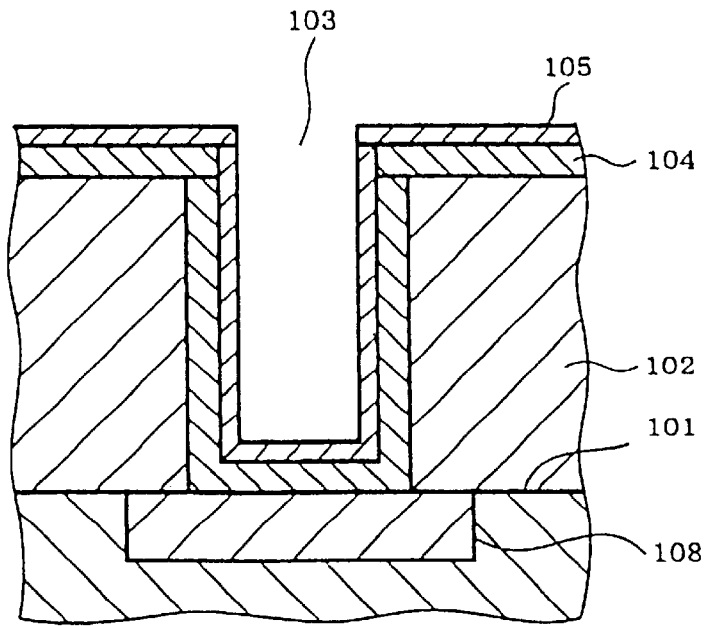
FIG. 3 shows a cross sectional view after a $TiSi_2$ layer and a TiN layer have been formed on the diffusion layer on the Si substrate inside the contact hole in the conventional W plug formation process that uses a CMP technique.
Figure 4:
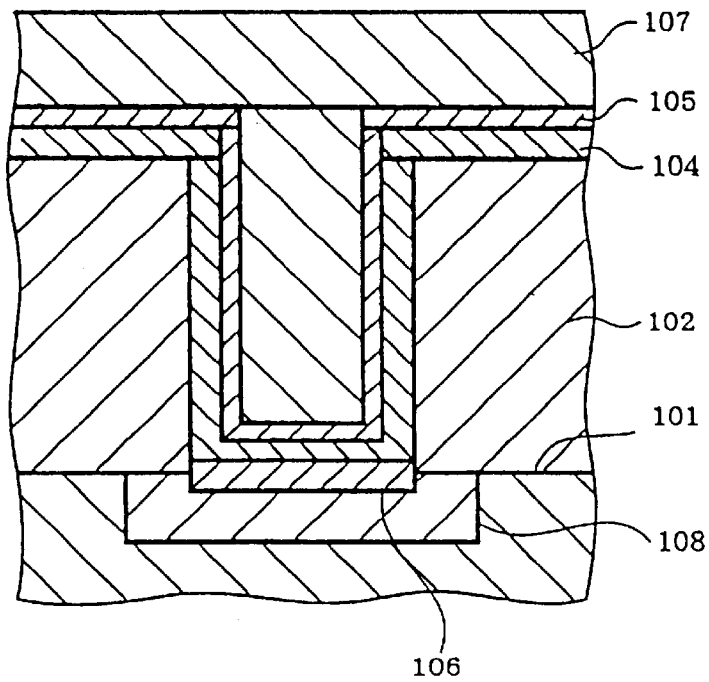
FIG. 4 shows a cross sectional view after a W layer has been formed in the conventional W plug formation process that uses a CMP technique.
Figure 5:
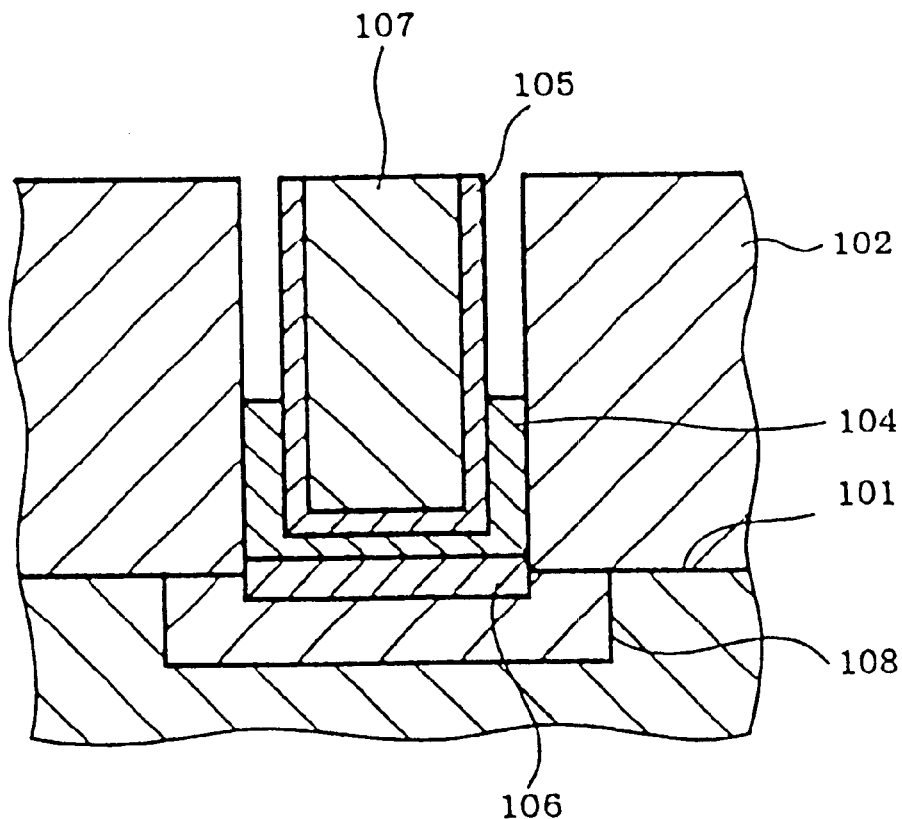
FIG. 5 shows a cross sectional view after the portion of the W layer not used to form a plug has been removed by the CMP method and have then been processed with hydrofluoric acid aqueous solution in the conventional W plug formation process that uses a CMP technique.

This set of film formation conditions can be determined from the relation between the $TiCl_4$ flow rate and the Ti film formation rate (Ti film formation speed) (Confer: T. Taguwa et al. 1997 VMIC Conference pp255–257 FIG. 3).

The film formation rate of the CVD-Ti layer on the $SiO_2$ interlayer insulating film 202 is maximized when the $TiCl_4$ flow rate is 3.5 sccm. However, if the $TiCl_4$ flow rate is increased beyond 3.5 sccm, the film formation rate of the CVD-Ti layer decreases. In particular, if the $TiCl_4$ flow rate is increased beyond 10 sccm, the film formation rate of the CVD-Ti layer decreases to zero. This phenomenon is caused by the following mechanism. In the CVD method, the raw material gas $TiCl_4$ decomposes at high temperature and Ti is then deposited. However, at the same time, $TiCl_x$ and Cl gas are generated, which etch and eventually remove the CVD-Ti layer. As a result, the film formation rate of the CVD-Ti layer decreases to zero.

Therefore, if the CVD-Ti layer is formed under the above-stated conditions, the CVD-Ti layer is formed only on the Si substrate 201 without forming a CVD-Ti layer on the $SiO_2$ interlayer insulating film 202. Moreover, this film formation process is carried out under a high temperature condition. Hence, when the CVD-Ti layer is formed on the Si substrate 201, a chemical reaction occurs between the CVD-Ti layer and the Si substrate 201. As a result, a CVD-$TiSi_2$ layer 204 of approximate thickness 100~500 Angstroms is formed selectively on the Si layer at the bottom of the contact hole but not on the side wall of the contact hole.

Figure 2:
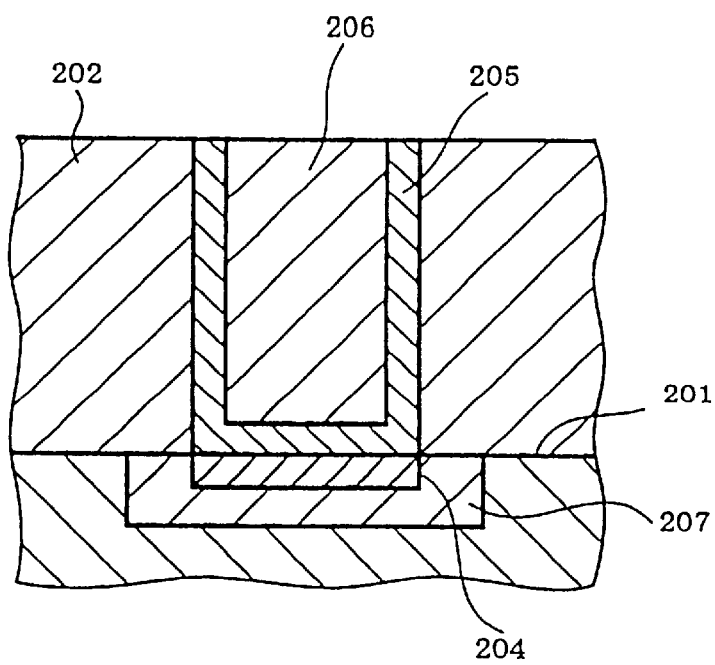
FIG. 2 shows a cross sectional view after a CVD-TiN layer and W layer have been formed in the W plug formation process according to the first through third embodiments of the invention.

Next, using the CVD method, a CVD-TiN film 205 of approximate thickness 200~500 Angstroms is formed. Next, as shown in FIG. 2, using the CVD method, a CVD-W film 206 of approximate thickness 300~800 Angstroms is formed. After this, the portion of the W layer 206 that is not to be used to form a plug is removed by the CMP method to form a W plug. The generated contaminants are then removed with hydrofluoric acid (aqueous solution of hydrofluoric acid). In this case, the CVD-Ti layer is not formed on the side wall of the contact hole. Therefore, the etching does not proceed to the CVD-$TiSi_2$ layer 204 so that contact conductivity failure never occurs.

Thus, by increasing the $TiCl_4$ flow rate above the level prescribed by the standard condition, the CVD-$TiSi_2$ layer 204 can be formed selectively only on the Si layer at the bottom of the contact hole, that is, by forming a CVD-Ti layer selectively only on the Si layer (diffusion layer) at the bottom of the contact hole while removing CVD-Ti layer formed on the side wall of the contact hole. Since the CVD-Ti layer is not formed on the side wall of the contact hole, even if the contaminants generated by the CMP method are removed with hydrofluoric acid, the etching does not proceed to the CVD-$TiSi_2$ layer so that contact conductivity failure never occurs. Moreover, there is no need to add a new process unlike the method in which the CVD-Ti layer formed on the side wall of the contact hole is removed by a selective etching process with ammonia aqueous solution or the like.

SECOND EMBODIMENT

In the first embodiment, the present invention is embodied by increasing the $TiCl_4$ flow rate above the level prescribed by the standard condition. However, by adding a halogen type gas such as HCl, $Cl_2$, or the like to the $TiCl_4$ flow rate at the proportion range of 0.05%~1% in addition to the standard film formation conditions, the etching of the CVD-Ti layer is carried out. Hence, the present invention can be embodied by this method also. In what follows, as in the case of the first embodiment, the second embodiment will be explained with reference to FIGS. 1 and 2.

First, as shown in FIG. 1, an interlayer insulating film 202 is deposited on a Si substrate 201 on which a device is formed. A contact hole 203 is then opened to obtain conductivity to the diffusion layer 207 of the Si substrate 201. Next, by the CVD method, a film of CVD-Ti layer is formed.

A set of exemplary film formation conditions in this case is provided below.

(halogen type gas flow rate)/(total gas flow rate): 0.05%~1%, (for example, HCl or $Cl_2$ flow rate: 1~10 sccm, $TiCl_4$ flow rate: 1~20 sccm, Ar flow rate: 3~2000 sccm, $H_2$ flow rate: 500~2000 sccm), film formation temperature: over 500° C., preferably over 550° C., film formation pressure: 0.5~5 Torr, and plasma power: 100~1000W.

Thus, by adding HCl, $Cl_2$, or the like to the $TiCl_4$ flow rate also, halogen type gas such as Cl gas or the like facilitates the etching of the CVD-Ti layer as in the case of the first embodiment. Therefore, the film formation process of the CVD-Ti layer on the side wall of the contact hole is suppressed, and a CVD-$TiSi_2$ layer of approximate thickness 100~500 Angstroms can be formed by having the diffusion layer 207 of the Si substrate 201 react with the CVD-Ti layer at the bottom of the contact hole.

Next, by the CVD method, a CVD-TiN layer film 205 of approximate thickness 200~500 Angstroms is formed. Next, as shown in FIG. 2, by the CVD method, a W film 206 of approximate thickness 300~800 Angstroms is formed. After this, by the CMP method, the portion of the W layer not used to form a plug is removed to form a W plug, and the generated contaminants are removed with hydrofluoric acid. In this case, no CVD-Ti layer is formed on the side wall of the contact hole. Hence, the etching does not proceed to the CVD-$TiSi_2$ layer 204 so that no contact conductivity failure occurs.

Thus, by adding a halogen type gas such as HCl, $Cl_2$, or the like in addition to the standard film formation conditions, a CVD-$TiSi_2$ layer can be formed by forming a CVD-Ti layer only on the diffusion layer (Si layer) at the bottom of the contact hole while simultaneously removing by an etching process the CVD-Ti layer formed on the side wall of the contact hole. Since the CVD-Ti layer is not formed on the side wall of the contact hole, even if the contaminants generated by the CMP method are removed with hydrofluoric acid, the etching does not proceed to the CVD-$TiSi_2$ layer so that contact conductivity failure never occurs. Moreover, there is no need to add a new process unlike the method in which the CVD-Ti layer formed on the side wall of the contact hole is removed by a selective etching process with ammonia aqueous solution the like.

THIRD EMBODIMENT

The $TiCl_4$ flow rate is increased to embody the present invention in the first embodiment. A halogen type gas such as HCl, $Cl_2$, or the like is added to embody the present invention in the second embodiment. However, in the present embodiment, by the plasma CVD method, a CVD-Ti layer (CVD-$TiSi_2$ layer) is first formed under the standard conditions. After this, $TiCl_4$ gas is supplied without plasma discharge. In this way also, the CVD-Ti layer formed on the side wall of the contact hole can be removed. In what follows, the present embodiment will be explained with reference to FIGS. 1 and 2.

First, as shown in FIG. 1, an interlayer insulating film 202 is deposited on a Si substrate 201 on which a device is formed. A contact hole 203 is then opened to obtain conductivity to the diffusion layer 207 of the Si substrate 201. Next, by the plasma CVD method, $TiCl_4$ gas is supplied at the flow rate of 1~20 sccm to form a film of Ti layer. Thus, a CVD-Ti layer and a $CVD-TiSi_2$ layer 204 are formed. Next, without discharging plasma, $TiCl_4$ gas is supplied at the flow rate of over 3 sccm to remove the CVD-Ti layer formed on the side wall (interlayer insulating film) 202 of the contact hole.

The formation process of the first CVD-Ti layer film is carried out by the plasma CVD method under the standard film formation conditions. A set of exemplary film formation conditions in this case is provided below.

$TiCl_4$ gas flow rate: 1~20 sccm, Ar flow rate: 300~2000 sccm, $H_2$ flow rate: 500~2000 sccm, film formation temperature: over 500° C., preferably over 550° C., film formation pressure: 0.5~5 Torr, and plasma power: 100~1000W.

Next, $TiCl_4$ gas is supplied without discharging plasma to remove the CVD-Ti layer formed on the side wall (interlayer insulating film) 202 of the contact hole. A set of exemplary film formation conditions in this case is provided below.

$TiCl_4$ gas flow rate: over 3 sccm, Ar flow rate: 300~2000 sccm, film formation temperature: over 400° C., preferably over 550° C., film formation pressure: 0.5~5 Torr, and no plasma discharge.

These film formation conditions can be determined from the relation between the wafer temperature in the case $TiCl_4$/Ar gas is supplied at a prescribed flow rate without plasma discharge and the etching rates of the Ti layer and $TiSi_2$ layer (Confer: the afore-mentioned VMIC, 255 (1997), FIG. 8).

In other words, in the absence of plasma discharge, the Ti layer is very easily etched by the $TiCl_4$/Ar gas supplied at the prescribed flow rate, and the etching rate is accelerated as the temperature rises. On the other hand, the $TiSi_2$ layer is etched very little at any wafer temperature. Therefore, by supplying $TiCl_4$/Ar gas under the above-described conditions after a film of CVD-Ti layer has been formed under the standard conditions, the CVD-Ti layer formed on the side wall of the contact hole can be removed. Thus, without forming a film of CVD-Ti layer on the $SiO_2$ interlayer insulating film, a $CVD-TiSi_2$ layer 204 of approximate thickness 100~500 Angstroms can be formed on the diffusion layer 207 of the Si substrate 201.

Next, as shown in FIG. 2, by the CVD method, a CVD-TiN film 205 of approximate thickness 200~500 Angstroms is formed. Next, by the CVD method, a W film 206 of approximate thickness 300~8000 Angstroms is formed. After this, by the CMP method, the portion of the W layer not used to form a plug is removed to form a W plug, and the generated contaminants are removed with hydrofluoric acid. In this case, no CVD-Ti layer is formed on t he side wall of the contact hole. Hence, the etching does not proceed to the $CVD-TiSi_2$ layer 204 so that no contact conductivity failure occurs.

Thus, by the plasma CVD method, after forming films of CVD-Ti layer and $CVD-TiSi_2$ layer, respectively, by supplying $TiCl_4$/Ar gas without plasma discharge, the CVD-Ti layer formed on the side wall of the contact hole can be removed. Since the CVD-Ti layer is not formed on the side wall of the contact hole, even if the contaminants generated by the CMP method are removed with hydrofluoric acid, the etching does not proceed to the $CVD-TiSi_2$ layer so that contact conductivity failure never occurs. Moreover, there is no need to add a new process unlike the method in which the CVD-Ti layer formed on the side wall of the contact hole is removed by a selective etching process with ammonia aqueous solution the like.

Moreover, unlike in the second embodiment, there is no need to add halogen type gas such as HCl and $Cl_2$. Therefore, fewer types of gas are needed, and the process conditions can be set more easily. Moreover, in the case the flow rate of $TiCl_4$ is increased as in the case of the first embodiment, there is a possibility that the Si substrate will be etched (Confer T. Miyamoto et al. pp195–197, 1995 VMIC Conference p196). However in the present embodiment, there is no need to increase the flow rate of $TiCl_4$. Hence, the Si substrate is not etched.

Only by increasing the flow rate of $TiCl_4$ above the flow rate prescribed by the standard conditions or by adding a halogen type gas such as HCl and $Cl_2$, in addition to the standard film formation conditions to form a Ti layer, a Ti layer can be formed on the Si layer at the bottom of the contact hole while simultaneously removing by an etching process the Ti layer formed on the parts besides the Si layer. Therefore, the Ti layer is not formed on any part besides the Si layer. As a result, a $TiSi_2$ layer is formed only on the Si layer. Moreover, even in the case a film of Ti layer is formed under the standard conditions, the Ti layer formed on portions other than the Si layer can be removed simply by stopping the discharge of plasma and then supplying $TiCl_4$ gas after the films of CVD-Ti layer and $CVD-TiSi_2$ layer have been formed.

What is claimed is:

1. A method for forming a titanium silicide layer, comprising:

forming an insulating layer over a surface layer of a silicon substrate;

forming a contact hole in the insulating layer to expose a portion of the surface layer of the silicon substrate, wherein the contact hole is defined by sidewalls of the insulating layer and by the exposed portion of the surface layer of the silicon substrate;

conducting a chemical-vapor-deposition process in which a $TiCl_4$ gas is supplied together with a carrier gas that contains at least $H_2$ to form a $TiSi_2$ layer within the exposed portion of the surface layer of the silicon substrate, wherein a flow rate proportion of the $TiCl_4$ gas with respect to a total gas flow rate is over 0.5% during said chemical-vapor-deposition process, and wherein Ti is not deposited into the sidewalls of the insulating layer during said chemical-vapor-deposition process.

2. A method for forming a titanium suicide layer, comprising:

forming an insulating layer over a surface layer of a silicon substrate;

forming a contact hole in the insulating layer to expose a portion of the surface layer of the silicon substrate, wherein the contact hole is defined by sidewalls of the insulating layer and by the exposed portion of the surface layer of the silicon substrate;

conducting a chemical-vapor-deposition process in which a $TiCl_4$ gas is supplied together with a carrier gas and at least one of a HCl gas and a $Cl_2$ gas to form a $TiSi_2$ layer within the exposed portion of the surface layer of the silicon substrate, wherein a flow rate proportion of the at least one of the HCl gas and the $Cl_2$ gas with respect to a gas flow rate of the $TiCl_4$ gas is within a range of 0.05% to 1% during said chemical-vapor-deposition process, and wherein Ti is not deposited into the sidewalls of the insulating layer during said chemical-vapor-deposition process.

3. A method for forming a titanium silicide layer, comprising:

forming an insulating layer over a surface layer of a silicon substrate;

forming a contact hole in the insulating layer to expose a portion of the surface layer of the silicon substrate, wherein the contact hole is defined by sidewalls of the insulating layer and by the exposed portion of the surface layer of the silicon substrate;

conducting a first chemical-vapor-deposition process in the presence of a plasma discharge in which a $TiCl_4$ gas is supplied at a flow rate of 1–20 sccm together with a carrier gas to form a $TiSi_2$ layer within the exposed portion of the surface layer of the silicon substrate and to form a titanium-containing layer in the sidewalls of the insulating layer; and conducting a second chemical-vapor-deposition process in the absence of a plasma discharge in which the $TiCl_4$ gas is supplied at a flow rate of over 3 sccm together with a carrier gas to remove the titanium-containing layer from within the sidewalls of the insulating layer.

* * * * *